United States Patent
Oh et al.

(10) Patent No.: US 7,061,795 B2
(45) Date of Patent: Jun. 13, 2006

(54) MAGNETIC RANDOM ACCESS MEMORY DEVICE

(75) Inventors: Hyung-Rok Oh, Gyeonggi-do (KR); Woo-Yeong Cho, Gyeonggi-do (KR); Su-Yeon Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 37 days.

(21) Appl. No.: 10/828,894

(22) Filed: Apr. 20, 2004

(65) Prior Publication Data

US 2004/0213040 A1 Oct. 28, 2004

(30) Foreign Application Priority Data

Apr. 22, 2003 (KR) .................. 10-2003-0025424

(51) Int. Cl.
*G11C 11/00* (2006.01)
*G11C 11/14* (2006.01)

(52) U.S. Cl. .................. 365/158; 365/171; 365/173

(58) Field of Classification Search ................ 365/158, 365/171, 173
See application file for complete search history.

(56) References Cited

U.S. PATENT DOCUMENTS

| | | | | |
|---|---|---|---|---|
| 5,764,567 A | * | 6/1998 | Parkin | 365/171 |
| 5,920,500 A | * | 7/1999 | Tehrani et al. | 365/173 |
| 5,946,227 A | * | 8/1999 | Naji | 365/158 |
| 6,191,972 B1 | | 2/2001 | Miura et al. | |
| 6,603,677 B1 | * | 8/2003 | Redon et al. | 365/158 |
| 6,822,897 B1 | * | 11/2004 | Ishikawa | 365/171 |
| 6,845,038 B1 | * | 1/2005 | Shukh | 365/171 |
| 6,909,628 B1 | * | 6/2005 | Lin et al. | 365/173 |
| 2002/0131295 A1 | | 9/2002 | Naji | |

FOREIGN PATENT DOCUMENTS

| | | |
|---|---|---|
| KR | 2002-0065323 | 8/2002 |
| KR | 2002-00741438 | 9/2002 |
| WO | WO 00/38192 | 6/2000 |

OTHER PUBLICATIONS

English language abstract of Korean Publication No. 2002-0065323.
English language abstract of Korean Publication No. 2002-0071438.

* cited by examiner

*Primary Examiner*—Trong Phan
(74) *Attorney, Agent, or Firm*—Marger Johnson & McCollom, P.C.

(57) ABSTRACT

A magnetic random access memory device includes a digit line, a bit line, and a magnetic memory cell disposed in an intersection between the digit line and the bit line. The digit line is extended in a first direction on a substrate. The bit line is extended in a second direction on the substrate. The magnetic memory cell includes a rectangular free magnetic layer magnetized in a direction according to an externally applied magnetic field. A major axis of the rectangular free magnetic layer is substantially parallel to the first direction, and a minor axis of the rectangular free magnetic layer is substantially parallel to the second direction. Thus, multiple input/output program (write) operations and multiple input/output repair operations may be effectively performed.

4 Claims, 4 Drawing Sheets

MAGNETIC RANDOM ACCESS MEMORY DEVICE

CROSS-REFERENCE TO RELATED APPLICATIONS

This application relies for priority upon Korean Patent Application No. 2003-25424 filed on Apr. 22, 2003, the contents of which are herein incorporated by reference for all purposes.

BACKGROUND OF THE INVENTION

1. Field of the Invention

This disclosure relates to a magnetic random access memory (MRAM) device and more particularly, to an MRAM device for performing a multiple input/output program (write) operation and a multiple input/output repair operation.

2. Description of the Related Art

A magnetic memory cell typically includes a magnetic tunneling junction (MTJ) and a transistor. The MTJ is disposed at the intersection of a digit line and a bit line. The transistor is a typical N channel field-effect transistor.

The typical MTJ having a rectangular shape has a magnetic anisotropy. The MTJ, in general, has a stack structure in which an anti-ferromagnetic layer, a fixed magnetic layer, a tunneling barrier disposed on the fixed magnetic layer, and a free magnetic layer disposed on the tunneling barrier are arranged in that order when viewed from a bottom of the MTJ. The anti-ferromagnetic layer is known as a bottom electrode, and the free magnetic layer is known as an upper electrode. The anti-ferromagnetic layer is connected to a drain electrode of the transistor. The digit line is electrically insulated from the anti-ferromagnetic layer and is disposed under the anti-ferromagnetic layer. The upper electrode or free magnetic layer is connected to the bit line. The fixed magnetic layer has a fixed direction of magnetization that is caused by the anti-ferromagnetic layer. The free magnetic layer is magnetized in a direction according to an externally applied magnetic field generated by the currents flowing in the bit line and the digit line.

Hereinafter, the principle of 'program (or write)' operation in the MRAM is described. The magnetization direction of the free magnetic layer is varied in accordance with the magnetic field induced by the currents flowing in the bit line and the digit line. The digit line is substantially perpendicular to the bit line.

The MTJ memory cell has a low (minimum) tunneling resistance value when the fixed magnetic layer has a magnetization direction that is the same as (substantially parallel with) that of the free magnetic layer. In this state, the MTJ memory cell stores data "0" and this state is referred to as "0"-state.

The MTJ has a high (maximum) tunneling resistance value when the respective magnetization directions of the fixed magnetic layer and the free magnetic layer are opposite to (substantially perpendicular with) each other. In this state, the MTJ memory cell stores data "1" and this state is referred to as "1"-state.

Thus, the MTJ has a variable resistance value that is changed depending upon the relative orientations of the magnetization directions of the fixed magnetic layer and the free magnetic layer. The MTJ memory cell is capable of storing 1-bit data ("1" or "0") according to two magnetization directions of the free magnetic layer.

At the present time, however, an MRAM that effectively performs multiple input/output program (write) operations and multiple input/output repair operations is not available.

Embodiments of the invention address these and other disadvantages of the conventional art.

SUMMARY OF THE INVENTION

Some embodiments of the invention provide a magnetic memory cell that effectively performs multiple input/output program (write) operations and multiple input/output repair operations. Other embodiments of the invention also provide an MRAM device capable of effectively performing multiple input/output program (write) operations and multiple input/output repair operations.

BRIEF DESCRIPTION OF THE DRAWINGS

The above and other features and advantages of the invention will become more apparent by describing in detail exemplary embodiments thereof with reference to the accompanying drawings.

DETAILED DESCRIPTION OF THE INVENTION

Figure 1:
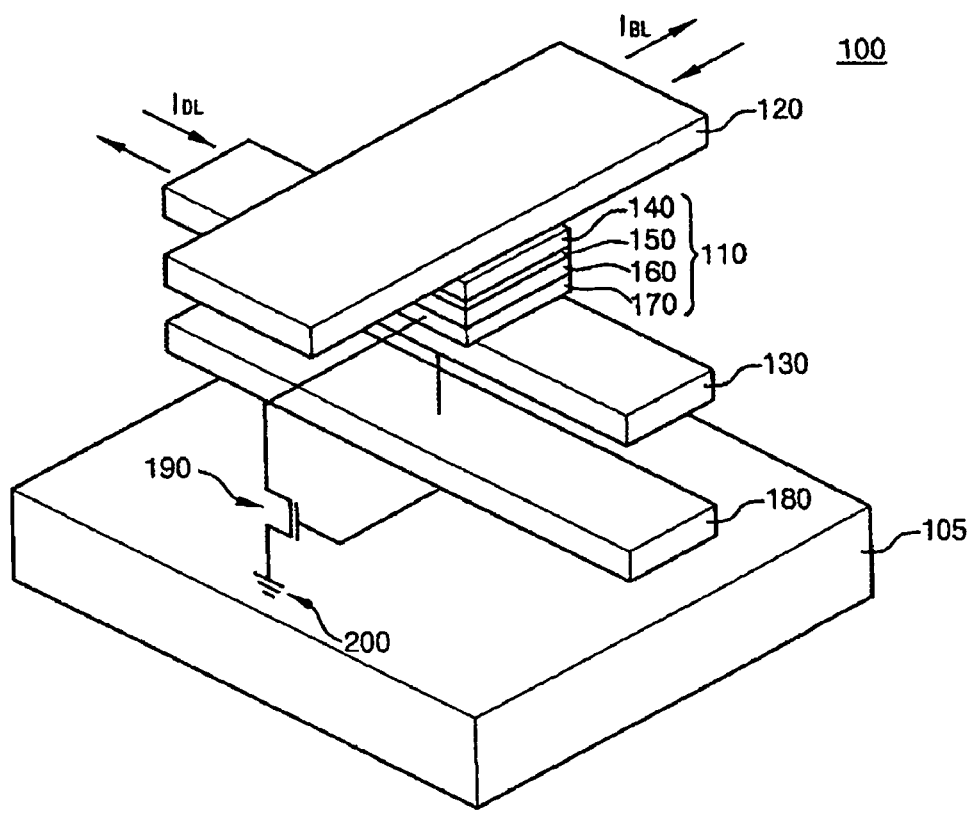
FIG. 1 is a perspective diagram illustrating a magnetic memory cell according to an exemplary embodiment of the invention.

Detailed illustrative embodiments of the invention are disclosed herein. However, specific structural and functional details disclosed herein are merely representative for purposes of describing exemplary embodiments of the invention. Thus, this invention may be embodied in many alternate forms and should not be construed as limited only to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined in the attached claims. Like reference numerals refer to like elements throughout the description of the figures.

FIG. 1 is a perspective diagram illustrating a magnetic memory cell according to an exemplary embodiment of the invention.

Referring to FIG. 1, the magnetic memory cell 100 includes a magnetic tunneling junction (MTJ) 110 and a transistor 190.

The MTJ 110 includes a free magnetic layer 140 disposed on a tunneling insulation layer 150, a fixed magnetic layer 60, and an anti-ferromagnetic layer 170.

The free magnetic layer 140 may include, e.g., NiFeCo or the like. The fixed magnetic layer 160 may include, e.g., NiFe or the like. The anti-ferromagnetic layer 170 may include magnetic material such as, e.g., IrMn or the like. A magnetization vector of the fixed magnetic layer 160 is fixed by the anti-ferromagnetic layer 170 disposed adjacent to the fixed magnetic layer 160. A magnetization vector of the free magnetic layer 140 varies according to the externally applied magnetic field.

For example, the tunneling insulation layer 150 may include an insulation material such as A1203. The tunneling insulation layer 150 may have a thickness of about 20 Å. Thus, a magnetic tunneling junction 110 is formed between the tunneling insulation layer 150 and the free magnetic layer 140, and between the tunneling insulation layer 150 and the fixed magnetic layer 160 due to the thin thickness of the tunneling insulation layer 150. A tunneling current flows through the magnetic tunneling junction. A bit line (or a data selection line) 120 is formed on the free magnetic layer 140, and is electrically coupled with the free magnetic layer 140. A digit line 130 is formed under the anti-ferromagnetic layer 170, and is electrically insulated from the anti-ferromagnetic layer 170. The transistor 190 and a word line 180 are formed under the digit line. The word line 180 is connected to the digit line 130. The word line 180 is electrically connected to a gate electrode of the transistor 190 to turn on or turn off the transistor 190.

As shown in FIG. 1, a source electrode of the transistor 190 is connected to a ground 200 and a drain electrode of the transistor 190 is connected to the anti-ferromagnetic layer 170.

Figure 2:
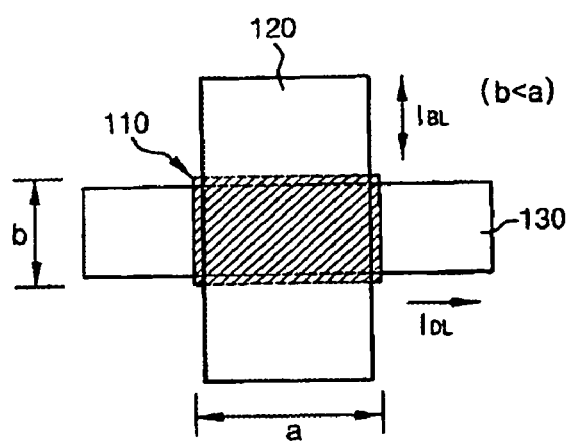
FIG. 2 is a plan diagram illustrating a magnetic tunnel junction of the magnetic memory cell of FIG. 1.

FIG. 2 is a plan diagram illustrating a magnetic tunnel junction (MTJ) of the magnetic memory cell of FIG. 1.

Referring to FIG. 2, the digit line extends in a row direction on a substrate, the bit line 120 extends in a column direction on the substrate, and the magnetic tunnel junction (MTJ) 110 is disposed in an intersection between the digit line 130 and the bit line 120. For example, the free magnetic layer 140 has a rectangular shape. A major axis 'a' of the free magnetic layer 140 is substantially parallel to the row direction, and a minor axis 'b' of the free magnetic layer 140 is substantially parallel to the column direction. A bi-directional current $I_{BL}$ is provided to the bit line 120, and a unidirectional current $I_{DL}$ is provided to the digit line 130.

FIGS. 3A through 3E are schematic diagrams illustrating the first magnetism mechanism at the magnetic tunnel junction of FIG. 2.

Figure 3A:
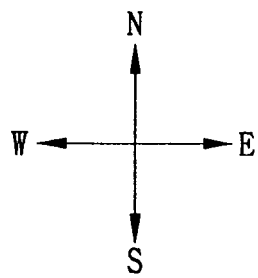
FIGS. 3A through 3E are schematicdiagrams illustrating the first magnetism mechanism at the magnetic tunnel junction of FIG. 2.

FIG. 3A is a diagram that represents the reference directions N., S., E. and W.

Figure 3B:
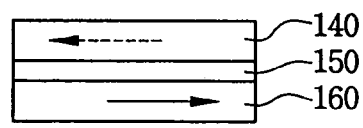

FIG. 3B is a diagram that represents a situation in which the magnetic memory cell 100 initially stores data '1'. A solid line denotes the magnetization direction of the fixed magnetic layer 160. The magnetization direction of the fixed magnetic layer 160 is fixed in the 'E.' direction.

A dotted line denotes the magnetization direction of the free magnetic layer 140. The magnetization direction of the free magnetic layer 140 is substantially in the 'W.' direction. Thus, the magnetization direction of the free magnetic layer 140 is in substantially "anti-parallel" with the magnetization direction of the fixed magnetic layer 160. "Anti-parallel" denotes that the magnetization directions of two magnetic layers are opposite to each other. The dotted line represents that the magnetization direction of the free magnetic layer 140 may be changed in accordance with externally applied magnetic field. The solid line represents that the magnetization direction of the fixed magnetic layer 160 is fixed regardless of the externally applied magnetic field.

Figure 3C:
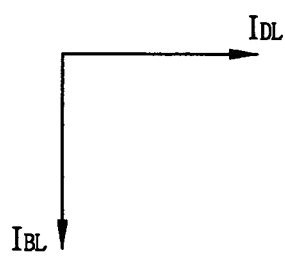

Referring to FIG. 3C, the current $I_{BL}$ is supplied to the bit line 120 in the 'S.' direction and the current $I_{DL}$ is supplied to the digit line 130 in the 'E.' direction while the magnetic memory cell 100 stores data '1'.

Figure 3D:
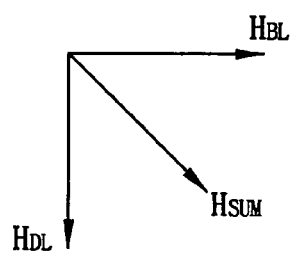
Figure 3E:
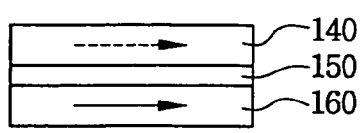

FIG. 3D shows a magnetic field $H_{SUM}$ induced by the currents $I_{BL}$ and $I_{DL}$ flowing through the bit line 129 and the digit line 130. The magnetic field $H_{BL}$ induced by the current $I_{BL}$ is in the 'E.' direction, and the magnetic field $H_{DL}$ induced by the current $I_{DL}$ is in the 'S.' direction. FIG. 3E represents that the magnetization direction of the free magnetic layer 140 is changed due to the $H_{SUM}$.

The $H_{SUM}$ changes the initial magnetization direction of the free magnetic layer 140 such that the magnetization direction of the free magnetic layer 140 is substantially "parallel" with the magnetization direction of the fixed magnetic layer 160. Thus, the MTJ 1 10 has a low (minimum) tunneling resistance value, and the magnetic memory cell 100 stores data "0". "Parallel" denotes that the magnetization directions of two magnetic layers are substantially parallel to each other.

Hereinafter, the principle of the variation of the tunneling resistance value of the magnetic tunneling junction is described.

A tunneling magneto-resistance (TMR) phenomenon occurs due to the difference between the densities of state of the spin of the ferromagnetic layers.

A tunneling probability between two ferromagnetic spins depends on the magnetization directions of the ferromagnetic materials. When the magnetization directions of two ferromagnetic materials are substantially identical to each other, a tunneling current has a maximum value. When the magnetization directions of two ferromagnetic materials are opposite to each other, a tunneling current has a minimum value. The spin directions of the ferromagnetic layers are changed from "parallel" (or "anti-parallel") to "anti-parallel" (or "parallel"), and the tunnel resistance value has a minimum value or maximum value. Thus, the magnetic memory cell functions as a storage cell.

FIGS. 4A through 4E are schematic diagrams illustrating the second magnetism mechanism at the magnetic tunnel junction of FIG. 2.

Figure 4A:
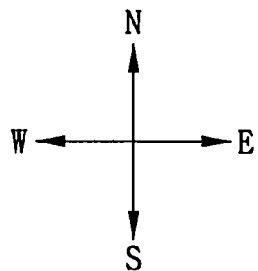
FIGS. 4A through 4E are schematic views showing the second magnetism mechanism at the magnetic tunnel junction of FIG. 2.

FIG. 4A is a diagram that represents the reference directions N., S., E., and W.

Figure 4B:

FIG. 4B is a diagram that represents a situation in which the magnetic memory cell 100 initially stores data '0'. A solid line denotes the magnetization direction of the fixed magnetic layer 160. The magnetization direction of the fixed magnetic layer 160 is fixed in the 'E.' direction. A dotted line denotes the magnetization direction of the free magnetic layer 140. The magnetization direction of the free magnetic layer 140 is substantially parallel to the 'E.' direction. Thus, the magnetization direction of the free magnetic layer 140 is substantially "parallel" to the magnetization direction of the fixed magnetic layer 160. The dotted line represents that the magnetization direction of the free magnetic layer 140 may be changed in accordance with externally applied magnetic field. The solid line represents that the magnetization direction of the fixed magnetic layer 160 is fixed regardless of the externally applied magnetic field.

Figure 4C:
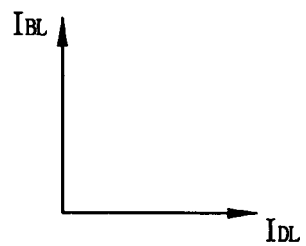

Referring to FIG. 4C, the current $I_{BL}$ is supplied to the bit line 120 in the 'N.' direction, and the current $I_{DL}$ is supplied to the digit line 130 in the 'E.' direction while the magnetic memory cell 100 stores data '0'.

Figure 4D:
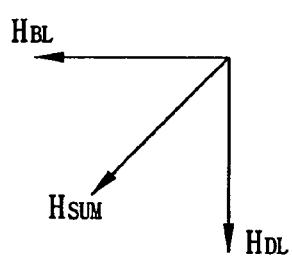

FIG. 4D shows a magnetic field $H_{SUM}$ induced by the currents $I_{BL}$ and $I_{DL}$ flowing through the bit line 129 and the digit line 130. The magnetic field $H_{BL}$ induced by the current $I_{BL}$ is in the 'W.' direction, and the magnetic field $H_{DL}$ induced by the current $I_{DL}$ is in the 'S.' direction.

Figure 4E:
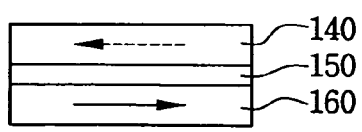

FIG. 4E represents that the magnetization direction of the free magnetic layer 140 is changed due to the $H_{SUM}$.

The $H_{SUM}$ changes the initial magnetization direction of the free magnetic layer 140 such that the magnetization direction of the free magnetic layer 140 is in substantially "anti-parallel" with the magnetization direction of the fixed magnetic layer 160. Thus, the MTJ 110 has a high (maximum) tunneling resistance value, and the magnetic memory cell 100 stores data "1".

Figure 5:
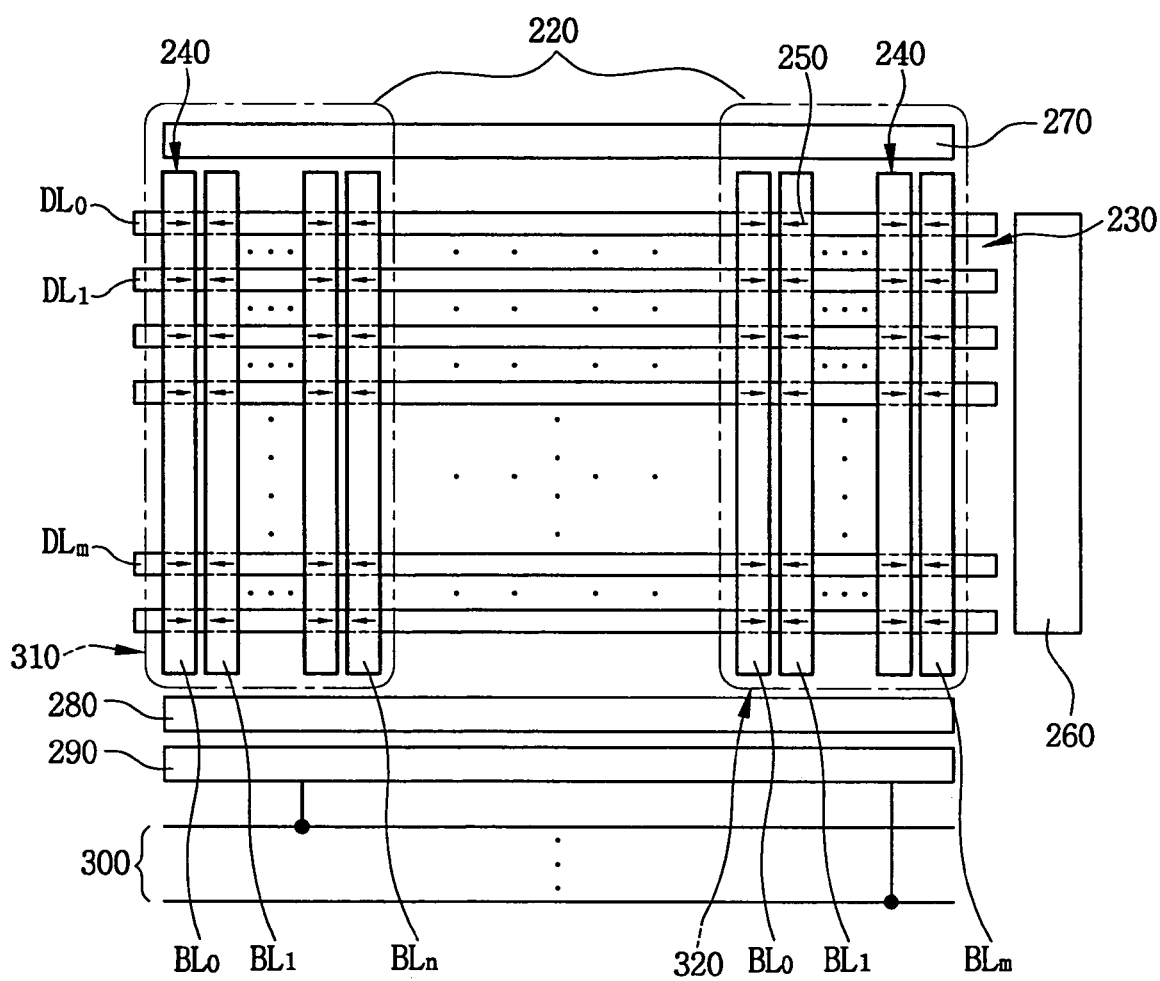
FIG. 5 is a schematic view showing a unit block of a magnetic random access memory device according to another exemplary embodiment of the invention.

FIG. 5 is a schematic diagram illustrating a unit block of a magnetic random access memory device according to another exemplary embodiment of the invention.

Referring to FIG. 5, the unit block of the magnetic random access memory device includes a block region 210. Alternately, the unit block of the magnetic random access memory device may include a plurality of block regions.

The block region 210 is divided into a plurality of sub-block regions 220 along the row direction. A plurality of digit lines 230 (DL0, DL1, . . . , DLn) extends in the row direction on the block region 210, and each of the digit lines 230 is arranged along the column direction. A plurality of word lines (not shown) is arranged substantially parallel with the digit lines 230 on the block region 210. A plurality of bit lines 240 (BL0, BL1, . . . , BLm) extends in the column direction on each of the sub-block regions 220, and each of the bit lines 240 is arranged along the row direction.

A plurality of magnetic memory cells, such as the magnetic memory cells 110 of FIG. 1, are disposed in intersections between the digit lines 230 and the bit lines 240. The magnetic memory cells respectively include a rectangular free magnetic layer 140. A major axis of the rectangular free magnetic layer 140 is substantially parallel to the row direction, and a minor axis of the rectangular free magnetic layer 140 is substantially parallel to the column direction. The magnetization directions of the magnetic memory cells are shown as arrows 250 in FIG. 5.

A row driver circuit 260 disposed at a first side of the block region 210 is configured to selectively activate the digit lines 230 and the word lines.

A first column driver circuit 270 disposed at a second side of the block region 210 is configured to selectively activate the bit lines 240 for each of the sub-block regions 220.

A second column driver circuit 280 disposed at a third side of the block region 210 is configured to selectively activate the bit lines 240 for each of the sub-block regions 220. The third side may face the second side.

A plurality of input/output lines 300 through which data is input or output is disposed adjacent to the bit lines 240.

A sensing-and-writing driver circuit 290 is disposed between the second column driver circuit 280 and the input/output lines 300. The sensing-and-writing driver circuit 290 is configured to selectively sense multiple bit lines for each of the sub-block regions 220 to couple the sensed bit lines with the input/output lines 300, and is configured to write data supplied from the input/output lines 300 into corresponding multiple bit lines.

Each of the magnetic memory cells in the each of the sub-block regions 220 are accessed by the bit lines 240 and the digit lines so as to perform multiple data write (or program) operations. When the row driver circuit 260 selects a plurality of word lines, the selected word lines turn on the transistors of the magnetic memory cells addressed by the selected word lines, and a current is supplied to the digit lines 230 in a first direction.

Afterwards, a current is supplied to the bit lines selected by the first and second column driver circuits 270 and 280 in two different directions. Thus, the magnetization direction of the free magnetic layer 140 of the addressed magnetic memory cell is changed so as to perform the write operation.

When the write operation is performed on the addressed magnetic memory cell 320 of the second sub-block region and the addressed magnetic memory cell 310 of the first sub-block region, the direction of the current supplied to the bit lines addressed by the first and second column driver circuits 270 and 280 is controlled, and the magnetization direction of the free magnetic layer 140 of the addressed magnetic memory cell is changed so as to perform the write operation.

The data write operation may be performed independently for each of the accessed magnetic memory cell, and thus the magnetic random access memory may perform multiple data write operations.

A digit line arranged substantially parallel with the word line is shared by a plurality of magnetic memory cells along the row direction. When magnetic memory cells have defects and the defective magnetic memory cells are replaced with redundant magnetic memory cells, repair operations may be performed simultaneously on a plurality of accessed magnetic memory cells arranged in the row direction, so that the repair operation may be effectively performed.

There are many ways to practice the invention. What follows are exemplary, non-limiting descriptions of several embodiments of the invention.

In an exemplary embodiment, a magnetic random access memory device includes a digit line extended in a first direction on a substrate, a bit line extended in a second direction on the substrate wherein the second direction is substantially perpendicular to the first direction, a magnetic memory cell disposed in an intersection between the digit line and the bit line wherein the magnetic memory cell includes a rectangular free magnetic layer magnetized in a direction according to an externally applied magnetic field, a major axis of the rectangular free magnetic layer being substantially parallel to the first direction, and a minor axis of the rectangular free magnetic layer being substantially parallel to the second direction.

In another exemplary embodiment, a multiple input/output magnetic random access memory device includes a substrate having at least one block region wherein the at least one block region respectively has a plurality of sub-block regions, a plurality of digit lines extended in a first direction on the at least one block region wherein each of the digit lines is arranged along a second direction and the second direction is substantially perpendicular to the first direction, a plurality of word lines arranged in substantially parallel with the digit lines on the at least one block region, a plurality of bit lines extended in the second direction on each of the sub-block regions wherein each of the bit lines is arranged along the first direction, a plurality of magnetic memory cells disposed in intersections between the digit lines and the bit lines wherein the magnetic memory cells respectively includes a rectangular free magnetic layer magnetized in a direction according to an externally applied magnetic field wherein a major axis of the rectangular free magnetic layer is substantially parallel to the first direction and a minor axis of the rectangular free magnetic layer is substantially parallel to the second direction, a row driver circuit that is configured to selectively activate the digit lines and the word lines wherein the row driver circuit is disposed at a first side of each of the block regions, a first column driver circuit that is configured to selectively activate the bit lines for each of the sub-block regions wherein the first column driver circuit is disposed at a second side of each of the block regions, a second column driver circuit that is configured to selectively activate the bit lines for each of the sub-block regions wherein the first column driver circuit being disposed at a third side of each of the block regions and the third side faces with the second side, a plurality of input/output lines, and a sensing-and-writing driver circuit that is configured to selectively sense multiple bit lines for each of the sub-block regions to couple the sensed bit lines with the input/output lines and configured to write data supplied from the input/output lines into corresponding multiple bit lines wherein the sensing-and-writing driver circuit is disposed between the second column driver circuit and the input/output lines. While the exemplary embodiments of the present invention and their advantages have been described in detail, it should be understood that various changes, substitutions and alterations may be made herein without departing from the scope of the invention as defined in the appended claims.

We claim:

1. A multiple input/output magnetic random access memory device comprising:

a substrate having at least one block region, the at least one block region having a plurality of sub-block regions;

a plurality of digit lines extended in a first direction on the at least one block region, each of the digit lines being arranged along a second direction, the second direction being substantially perpendicular to the first direction;

a plurality of word lines arranged substantially parallel with the plurality of digit lines on the at least one block region;

a plurality of bit lines extended in the second direction on each of the sub-block regions, each of the bit lines being arranged along the first direction;

a plurality of magnetic memory cells disposed in intersections between the digit lines and the bit lines, the magnetic memory cells each including a rectangular free magnetic layer magnetized in a direction according to an externally applied magnetic field, a major axis of the rectangular free magnetic layer being substantially parallel to the first direction, and a minor axis of the rectangular free magnetic layer being substantially parallel to the second direction;

a row driver circuit that is configured to selectively activate the digit lines and the word lines, the row driver circuit being disposed at a first side of each of the block regions;

a first column driver circuit that is configured to selectively activate the bit lines for each of the sub-block regions, the first column driver circuit being disposed at a second side of each of the block regions;

a second column driver circuit that is configured to selectively activate the bit lines for each of the sub-block regions, the first column driver circuit being disposed at a third side of each of the block regions, the third side facing the second side;

a plurality of input/output lines; and a sensing-and-writing driver circuit that is configured to selectively sense multiple bit lines for each of the sub-block regions to couple the sensed bit lines with the input/output lines, and configured to write data supplied from the input/output lines into corresponding multiple bit lines, the sensing-and-writing driver circuit being disposed between the second column driver circuit and the input/output lines.

2. The device of claim 1, the magnetic memory cell comprising:

a fixed magnetic layer having a fixed direction of magnetization, the fixed magnetic layer disposed over the digit lines;

an insulation layer disposed on the fixed magnetic layer; and the rectangular free magnetic layer disposed on tunneling insulation layer and electrically coupled with the bit line.

3. The device of claim 1, the magnetic memory cell further comprising an antimagnetic layer facing a lower surface of the fixed magnetic layer.

4. The device of claim 1, the magnetic memory cell further comprising a switching element that is configured to be switched by each of the word lines to be electrically coupled with the fixed magnetic layer when the switching element is selected by the each of the word lines.

* * * * *